United States Patent
Joshi

(10) Patent No.: US 7,236,408 B2
(45) Date of Patent: Jun. 26, 2007

(54) ELECTRONIC CIRCUIT HAVING VARIABLE BIASING

(75) Inventor: Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 11/184,698

(22) Filed: Jul. 19, 2005

(65) Prior Publication Data

US 2007/0018257 A1 Jan. 25, 2007

(51) Int. Cl.
*G11C 16/04* (2006.01)
(52) U.S. Cl. .......................... 365/189.09; 365/189.01; 365/177; 365/185.27
(58) Field of Classification Search .......... 365/189.09, 365/189.01, 185.27, 177, 185.18; 257/368, 257/369, 500
See application file for complete search history.

(56) References Cited

U.S. PATENT DOCUMENTS 6,510,088 B2 * 1/2003 Chen et al. ............ 365/189.09
6,576,505 B2 * 6/2003 Borghs et al. ............... 438/167
6,911,703 B2 * 6/2005 Hidaka .................. 365/189.09

OTHER PUBLICATIONS

Joshi, Rajiv V., "Random Access Memory with Stability Enhancement and Early Read Elimination," U.S. Appl. No. 10/985,453, filed Nov. 10, 2004.

\* cited by examiner

*Primary Examiner*—David Lam
(74) *Attorney, Agent, or Firm*—Ryan, Mason & Lewis, LLP

(57) ABSTRACT

Techniques are provided for selectively biasing wells in a circuit, such as a Complementary Metal Oxide Semiconductor (CMOS) circuit, that has two types of transistors, one type formed on a substrate and another type formed on the wells. For example, the circuit can be a memory circuit, and the selective well bias can be changed depending on whether a READ or WRITE operation is being conducted. In another aspect, cells in a memory circuit can be subjected to variable bias depending on conditions, such as, again, whether a READ or WRITE operation is underway.

20 Claims, 9 Drawing Sheets

| BSEARLY | WCEARLY | BSWC EARLY | BSWC INVERTED | OPERATION | Pfet BODY |
|---|---|---|---|---|---|
| 0 | 0 | 0 | 1 | COLUMN UNSELECT | 0 STRONG |
| 0 | 1 | 0 | 1 | COLUMN UNSELECT | 0 STRONG |
| 1 | 0 | 1 | 0 | COLUMN SELECT "WRITE" | $V_{CS}$ WEAK |
| 1 | 1 | 0 | 1 | COLUMN SELECT "READ" | 0 STRONG |

FIG. 9

| BSEARLY | WCEARLY | BSWC | OPERATION | $V_{CSV}$ |
|---------|---------|------|-----------|-----------|
| 0 | 0 | 0 | COLUMN UNSELECT | $V_{CS}$ |
| 0 | 1 | 0 | COLUMN UNSELECT | $V_{CS}$ |
| 1 | 0 | 1 | COLUMN SELECT "WRITE" | $V_{CS} - V_{t\ DROP}$ |
| 1 | 1 | 0 | COLUMN SELECT "READ" | $V_{CS}$ |

ELECTRONIC CIRCUIT HAVING VARIABLE BIASING

FIELD OF THE INVENTION

The present invention generally relates to the electrical arts and, more particularly, to electronic circuitry.

BACKGROUND OF THE INVENTION

As circuit fabrication technology scales, inter-die and intra-die variations in process parameters such as channel length, L, width, W, threshold voltage, $V_t$, and the like, have become serious problems in circuit design. For example, the device-to-device (intra-die) variations in L, W or $V_t$ between neighboring transistors in a static random access memory (SRAM) cell can significantly degrade the stability of the cell and can result in read and write delays. The $V_t$ of a field effect transistor (FET) of the p-type (PFET) may degrade due to a negative bias instability (NBTI) effect after burn-in, leading to problems with $V_{min}$ (the minimum voltage required to operate the memory cell) during READ and WRITE operations. If the PFET is made too strong (i.e., relatively high drain current $i_D$ for a given drain-source voltage differential $V_{DS}$) the write margin may degrade significantly.

Accordingly, it would be desirable to address various issues arising in electronic circuit design, such as, for example, those arising in electronic circuits having several operating modes (e.g. a "READ" mode and a "WRITE" mode) as may be found in electronic memory circuits.

SUMMARY OF THE INVENTION

Principles of the present invention provide techniques for variable biasing of electronic circuits. An exemplary embodiment of an electronic circuit, according to one aspect of the present invention, may have a substrate of a first type, for example, either a p-type or an n-type, and may further have a well formed in the substrate. The well may typically be of the opposite type as the substrate. Further, the exemplary circuit may have at least one FET of the same type as the well, that is fabricated on the substrate, and at least one FET of the same type as the substrate, that is, fabricated on the well. The exemplary circuit can further include well-biasing circuitry. Such well-biasing circuitry can be configured to bias the well in a first manner, which is pre-selected for a first mode of operation, and a second manner, different than the first manner, which is pre-selected for a second mode of operation.

In one or more exemplary embodiments of the present invention, the electronic circuit can be a memory circuit, such as an SRAM circuit. The substrate can be p-type, and the well can be n-type. Further, the PFETS can employ hybrid orientation technology (HOT). Yet further, the bias in the first manner can be a reduced bias, compared to a second manner, to strengthen current versus voltage characteristics of the FET during a READ operation, while the bias can be increased to weaken current versus voltage characteristics during a WRITE operation.

In anther aspect, one or more exemplary embodiments of the present invention can include memory circuits where biasing of the transistors in the memory cells is changed for READ and WRITE operations.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 9 depicts a truth table for the cell-biasing circuitry of FIG. 8;

DETAILED DESCRIPTION OF PREFERRED EMBODIMENTS

Figure 1:
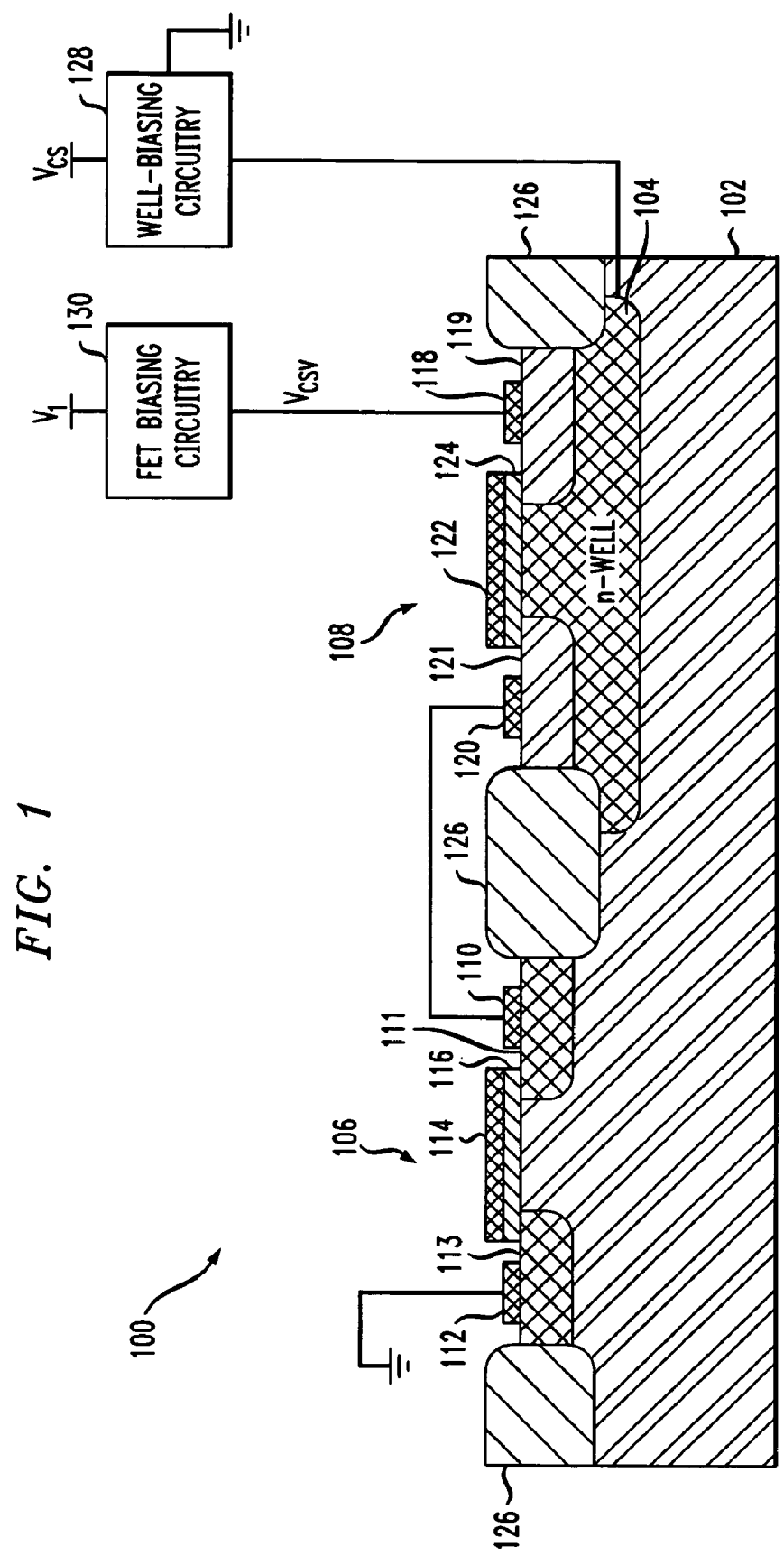
FIG. 1 shows an exemplary embodiment of an electronic circuit according to one aspect of the present invention.

Attention should now be given to FIG. 1, which depicts an exemplary electronic circuit 100 according to one aspect of the present invention. Circuit 100 has at least first and second modes of operation. Such modes can be broadly understood as any type of mode, operating level, operating state, operating condition (including any idle or similar mode), or the like, which can benefit from variable biasing of wells and/or transistors. As will be discussed below, in an exemplary memory circuit, the modes of operation could be, for example, a "READ" and a "WRITE" mode. Circuit 100 includes a substrate 102 of a first type, either p-type or n-type. Circuit 100 further includes a well 104 formed in substrate 102. Well 104 typically is the opposite type from substrate 102. In the example shown in FIG. 1, substrate 102 is p-type while well 104 is n-type. (One could also refer to the substrate as being of a first type of material and the well as being of a second type of material; using such nomenclature, a single material, such as silicon, doped in two different ways so as to result in two different conductivity types, such as p and n, could constitute a first type of material when doped in one way, such as p, and a second type of material when doped in another way, such as n.) Circuit 100 also includes at least one FET 106 of the same type as the well 104, which is fabricated on the substrate 102. Additionally, circuit 100 includes at least one FET 108 of the same type as substrate 102, which is fabricated on the well 104.

In the exemplary embodiment depicted in FIG. 1, circuit 100 is a complementary metal oxide semi-conductor (CMOS) integrated circuit. Note that transistor 106 includes a drain formed by contact 110 and associated n-type region 111, and a source formed by contact 112 and associated n-type region 113. Further, transistor 106 includes gate 114 with an appropriate insulating layer 116. Transistor 108 includes a source formed by contact 118 and associated p-type region 119, and a drain formed by contact 120 and associated p-type region 121. Transistor 108 further includes gate 122 with associated insulator 124. Appropriate isolation regions 126 may be formed, for example, from $SiO_2$. Transistor 108 may optionally be formed using HOT, wherein different silicon crystal orientations are employed to maximize PFET performance.

Circuit 100 further includes well-biasing circuitry 128, which is configured to bias the well 104 in a first manner that is pre-selected for the first mode of operation and a second manner, different than the first manner, pre-selected for the second mode of operation. Various exemplary types of well-biasing circuitry will be discussed below.

Circuit 100 can also include FET-biasing circuitry 130. Such circuitry can be connected with at least transistor 106 and can be configured to bias transistor 106 in at least two different manners which can correspond, for example, to the first and second operating modes discussed above. Several specific embodiments of FET-biasing circuitry will be discussed below. Note that as depicted in FIG. 1, circuitry 130 is electrically interconnected with the source of transistor 108; the drains of transistors 106, 108 are electrically interconnected; and the source of transistor 106 is grounded. Thus, it will be appreciated that circuitry 130 may, in general, have a biasing effect on transistor 106 and/or transistor 108. Note that the function of circuitry 130 is to bias the transistor(s) per se rather than the wells (although embodiments combining the functionality of circuitry 128 and 130 are possible in one or more embodiments of the present invention).

Circuitry 130 may have a suitable supply voltage $V_1$ and may apply a voltage designated as $V_{CSV}$ to the source of transistor 108. Further, well-biasing circuitry 128 may have a supply voltage $V_{CS}$. Note further that well 104 may be provided with a suitable well contact, which, for purposes of illustrative convenience, is not explicitly shown in FIG. 1, but is suggested by the line interconnecting circuitry 128 with well 104.

Figure 2:
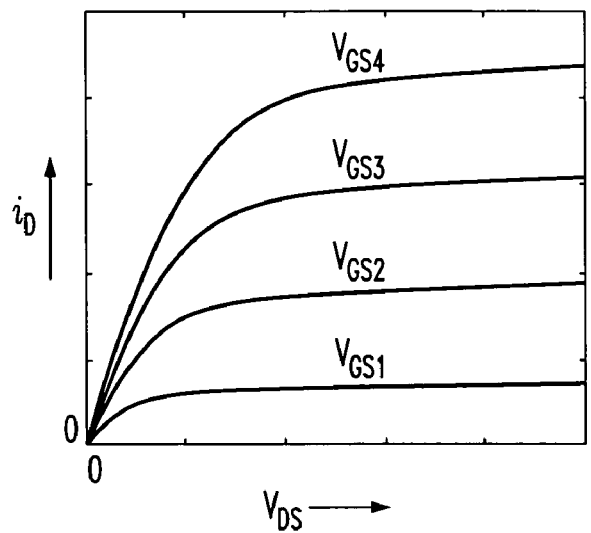
FIG. 2 shows drain current versus drain-source voltage characteristics of an exemplary n-type FET (NFET); in particular, for an n-type metal oxide semiconductor FET (MOSFET)
Figure 3:
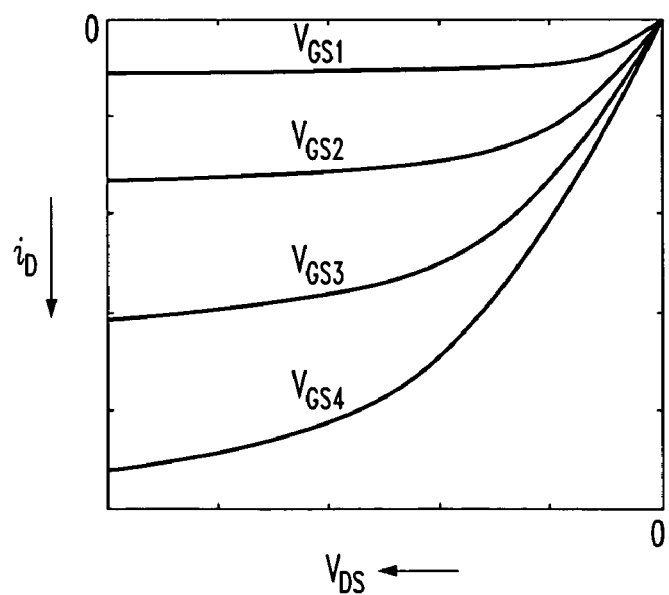
FIG. 3 is a family of curves similar to FIG. 2 but for a PFET; in particular, a p-type MOSFET.

Attention should now be given to FIGS. 2 and 3, which are applicable, respectively, to NFETS and PFETS. Note that throughout the present application, including the claims, reference is made to actions which "strengthen" or "weaken" current versus voltage characteristics of FETS. With reference to FIG. 2, in the context of an NFET, reference to strengthening current versus voltage characteristics is intended to refer to changes in bias which result in a greater drain current $i_D$ for a given drain-source voltage differential $V_{DS}$ (i.e., the curve for gate-source voltage $V_{GS4}$ represents a "stronger" current versus voltage characteristic as compared to the curve for $V_{GS1}$). Conversely, actions which "weaken" the current versus voltage characteristic are intended to refer to actions which result in a lower drain current $i_D$ for a given drain-source current $V_{DS}$. That is, curve $V_{GS1}$ represents a "weakened" FET compared to curve $V_{GS4}$.

In FIG. 3, curves evidencing a larger (negative) drain current $i_D$ for a given (negative) drain-source voltage differential $V_{DS}$ are considered "stronger" than curves having a lesser drain current for a given drain-source voltage differential (i.e., curve $V_{GS4}$ is considered to indicate a stronger current versus voltage characteristic than does curve $V_{GS1}$). Thus, by way of example, the aforementioned bias in the first manner could be a reduced bias, compared to the second manner, such that current versus voltage characteristics of transistor 108 were strengthened during a second mode of operation, while bias in a second manner could include an increased bias, compared to the first manner, such that current versus voltage characteristics of the transistor 108 were weakened during the first mode of operation. Note that, as discussed above, the aforementioned first and second modes could be, for example, READ and WRITE modes in a memory circuit. However, as discussed above, the present invention can be extended to any type of circuit that has different operating modes and can benefit from different biases, and can also be extended to additional modes (biasing and/or operating) beyond first and second modes.

With reference to both FIGS. 2 and 3, it will be appreciated that the drain current of a FET is normally a function of the gate-source voltage differential, the threshold voltage, the drain-source voltage differential, and various physical device parameters. "Strengthening" and "weakening" have been discussed in the context of families of gate-source voltage curves, but the terms are equally applicable to changes in drain current for a given $V_{DS}$ produced by changes in threshold voltage $V_t$. Such changes in $V_t$ may, in turn, be the result of changing the well bias (or substrate bias for devices formed directly on the substrate).

Figure 4:
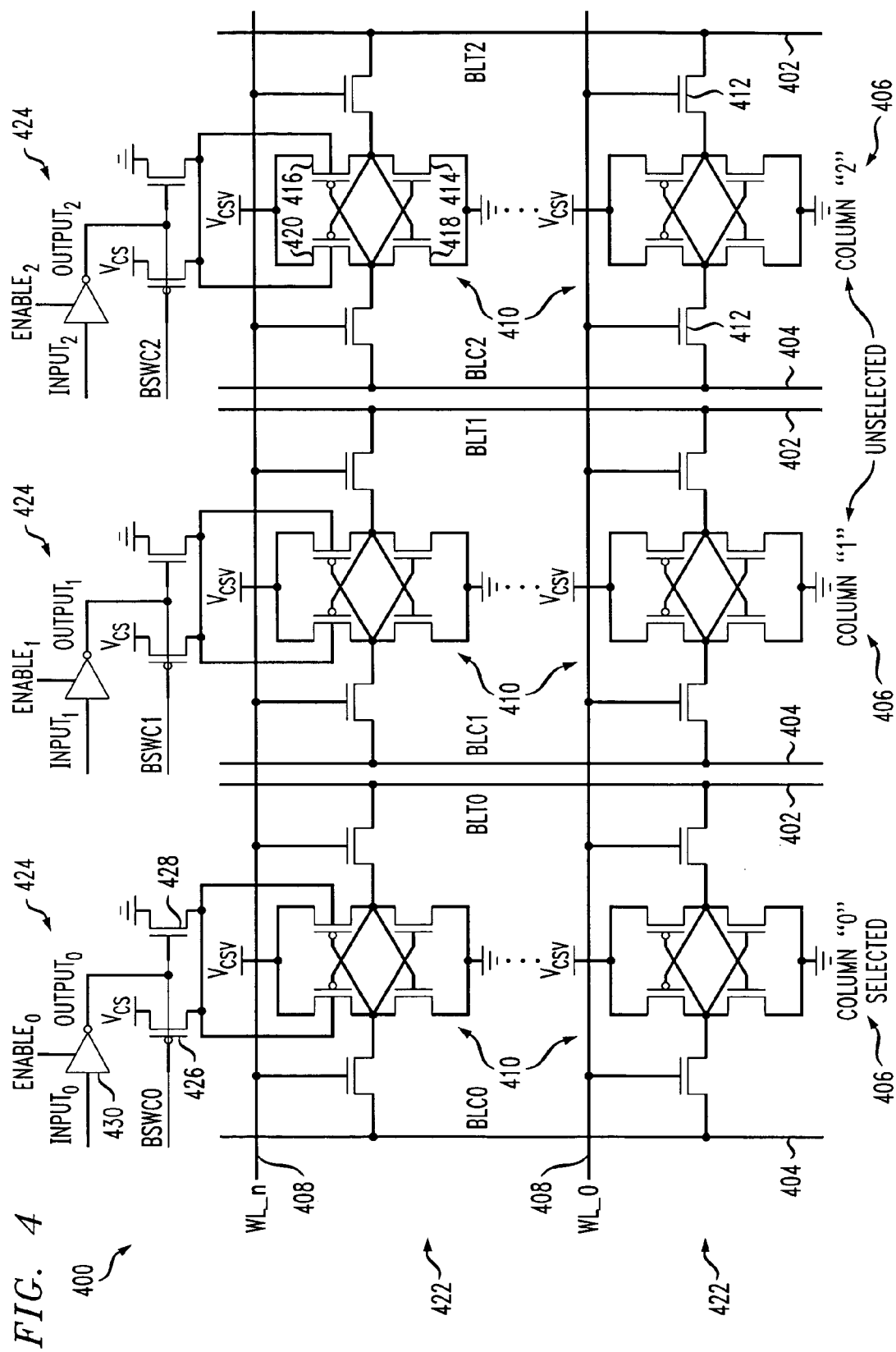
FIG. 4 shows an exemplary embodiment of a memory circuit, including well-biasing circuitry, in accordance with one aspect of the present invention.

Attention should now be given to FIG. 4, which depicts an exemplary embodiment of a memory circuit 400 in accordance with an aspect of the present invention. It will be appreciated that circuit 400, although depicted in schematic form, would typically be formed on a substrate, either p-type or n-type. Further, circuit 400 can typically include both NFETS and PFETS and can normally include a number of wells that are formed in the substrate. The wells are either p-type or n-type, and are typically the opposite type from the substrate. Circuit 400 includes a number of bit line structures. In the exemplary embodiment of FIG. 4, each structure is formed by a true bit line 402 and a complementary bit line 404. While the true and complementary pairs are shown in the exemplary embodiment of FIG. 4, it will be appreciated that the principles of the present invention may be applied to configurations where only a single bit line is employed for each structure. Circuit 400 can also include a number of word lines 408 that intersect the bit line structures formed by bit lines 402, 404 to form a number of cell locations. In the exemplary embodiment of FIG. 4, three bit line structures are shown intersecting a word line numbered "0" and a word line numbered "n." Additional word lines may be provided as indicated by the ellipses. Memory circuit 400 can also include a number of cells 410 located at the cell locations formed by the intersection of the word lines 408 with the bit line structures formed by bit line pairs 402, 404. Each of the cells can be selectively coupled to a corresponding one of the bit line structures, for example, through pass transistors 412. Such coupling can be under control of a corresponding one of the word lines 408. When the appropriate signal is applied to a given one of the word lines, a voltage is applied to the gates of pass transistors 412, causing them to conduct and interconnect the appropriate cell(s) 410 with the bit line structures formed by the true and complementary bit lines 402, 404.

Each of the cells 410 can include at least a first field effect transistor 414 that is fabricated on the substrate and is of the opposite type from the substrate. In the exemplary embodiment shown in FIG. 4, the substrate is p-type, the wells are n-type, and the first field effect transistor is an NFET. Further, cell 410 can include a second FET 416 that is fabricated on a corresponding one of the wells. The second FET 416 will typically be of the same type as the substrate. In the exemplary embodiment shown in FIG. 4, the second FET 416 is a PFET fabricated on an n-well, and the cells are standard 6-transistor static random access memory (6T SRAM) cells. Each cell includes an additional NFET 418 and an additional PFET 420 electrically interconnected with transistors 414, 416 in a well-known manner, resulting in a flip-flop formed by two cross-coupled inverters. It should be understood that the 6T cell is shown for illustrative purposes, and an 8-transistor cell or a variety of other cell types could be used.

Circuit 400 can further include well-biasing circuitry. The well-biasing circuitry can be configured to bias appropriate ones of the wells in a first manner that is appropriate for a READ operation and a second manner, which is different from the first manner, which is appropriate for a WRITE operation. It will be appreciated that cells 410 are formed, in the exemplary embodiment of FIG. 4, in a plurality of rows 422 and a plurality of columns 406. In the exemplary embodiment shown in FIG. 4, the well-biasing circuitry can include a number of column well-biasing units 424. Each of the units 424 can include a first control FET 426 that is configured to be held at a supply voltage $V_{CS}$. First control FET 426 can also have a gate that is configured to be set at a control voltage bswc, and a second drain/source terminal. It should be noted that in the exemplary embodiment of FIG. 4, each PFET 416, 420, can be formed on its own n-well, each column 406 can correspond to a given one of the bit line structures formed by true and complementary bit line pairs 402, 404, and some or all of the wells associated with the PFETS in a given column 406 can be electrically interconnected. The second drain/source terminal of first control FET 426 can be coupled to the electrically interconnected wells of the corresponding ones of the columns 406.

Column well-biasing unit 424 can further include a second control FET 428 that has a first drain/source terminal coupled to the electrically interconnected wells of the corresponding one of the columns 406, a gate that is configured to be set at the control voltage bswc, and a second drain/source terminal that is configured to be grounded. The second control FET is of the opposite type to the first control FET; in the exemplary embodiment of FIG. 4, the first control FET is a PFET and the second control FET is an NFET. It will be appreciated that when the control voltage bswc is set at a first logical level, the first control FET 426 will conduct to set the electrically interconnected wells of the corresponding column 406 to the supply voltage $V_{CS}$. When the control voltage bswc is set at a second logical level that is opposite to the first logical level, the second control FET 428 will conduct so as to ground the electrically interconnected wells of the corresponding one of the columns. Column well-biasing unit 428 can further include an enabled inverter 430 having a first input, an enable input, and an output that is coupled to the gates of the first and second control FETS 426, 428.

During the READ operation, a reduced bias can be applied to the wells in order to strengthen current versus voltage characteristics of the FETS formed on the wells during the READ operation. Thus, during a READ operation, the appropriate control signal can be applied to the gates of transistors 426, 428 in order to ground the wells. Conversely, for a WRITE operation, the appropriate control signal can be supplied to hold the wells at the supply voltage $V_{CS}$ in order to weaken the current versus voltage characteristics of the FETS formed on the wells during the WRITE operation. The "strengthening" and "weakening" are relative terms comparing the current versus voltage characteristics, discussed above, of the FETS formed on the wells in the two different cases, namely, READ and WRITE. It should be noted that the well-biasing circuitry discussed with respect to FIG. 4 is one possible type of well-biasing circuitry that could be used with respect to the general case shown in FIG. 1. Note also that appropriate biasing can be used during conditions other than "READ" and "WRITE"; for example, in the so-called "half-select" condition, where a given word line is selected but a given column is not, the FETS in the wells can be maintained with a relatively strong current versus voltage characteristic by grounding the well.

In the exemplary embodiment shown in FIG. 4, the PFETS can be in bulk formed on the indicated n-wells. The NFETS can be in bulk. Silicon on insulator (SOI) construction can also be employed. The mobilities of the PFETS can be enhanced by fabricating them in HOT. Note that the grounding of the n-wells during the half-select condition, with concomitant strengthening of the PFETS, increases the ability of the cell to hold its state during the half-select condition. This effect is enhanced when using HOT, inasmuch as the PFETS have high mobility, that is, the ratio of the PFET to NFET mobilities is higher compared to conventional substrate technologies. Since the PFETS tend to have high mobility when operating at higher voltages, desired stability increases can be obtained during the half-select condition. Furthermore, the minimum voltage necessary to operate the cell, $V_{min}$, can be improved, as the high mobility PFETS can operate at lower voltages during the WRITE operation. The strengthening of the current voltage characteristics during the READ operation helps in reading of the data. Thus, during the READ, WRITE, and the half-select conditions, appropriate device strength can be obtained to minimize stability degradation. During the half-select condition, conventional practice is to maintain the bit lines at the logic level "1" voltage. In one or more exemplary embodiments of the present invention, the bit lines can be allowed to float during the half-select condition to improve stability. Note that while the exemplary embodiment of FIG. 4 depicts PFETS formed in n-wells, the structure can be formed in a reverse manner, that is, NFETS can be substituted for the PFETS (and vice-versa), an n-substrate can be used in lieu of a p-substrate, and p-wells can be used instead of n-wells. In the latter case, a triple well structure could be employed, for example, a p-substrate, a p-well, and an NFET. In such case, appropriate polarity changes could be implemented as required.

Figures 5, 6:
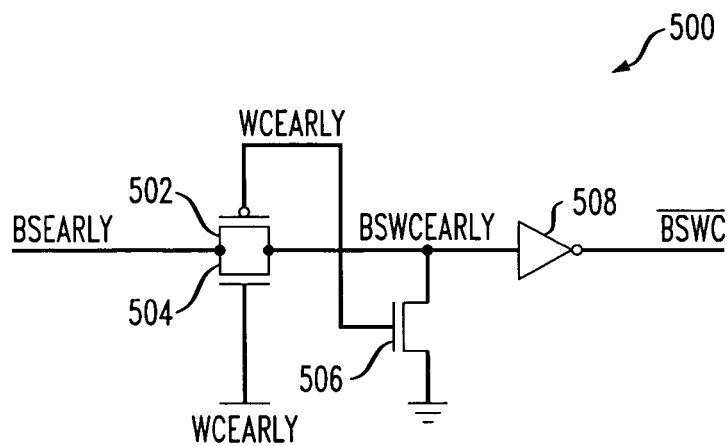
FIG. 5 depicts an alternative embodiment of well-biasing circuitry in accordance with another aspect of the present invention.
FIG. 6 shows a truth table for the well-biasing circuitry of FIG. 5.

Turning now to FIG. 5, an exemplary control portion 500 of inventive well-biasing circuitry, according to another aspect of the present invention, is depicted. Portion 500 can be substituted for enabled inverter 430 (and can also be used with respect to the general case of FIG. 1). More particularly, the output of portion 500 is the inverted bswc signal, $\overline{bswc}$. Such signal is applied to the gates of transistors 426, 428 in FIG. 4. Portion 500 includes a third control FET 502 having a first drain/source terminal that is configured to be held at control voltage bsearly, a gate, and a second drain/source terminal. Portion 500 further includes a fourth control FET 504 that has a first drain/source terminal coupled to the first drain/source terminal of the third control FET 502, a gate, and a second drain/source terminal. Still further, portion 500 includes a fifth control FET 506 having a first drain/source terminal that is coupled to the second drain/source terminals of the third and fourth control FETS, a gate that is coupled to the gate of the third control FET, and a second drain/source terminal that is configured to be grounded. Yet further, portion 500 can include an inverter 508 that is coupled to the second drain/source terminals of the third and fourth control FETS 502, 504 and that has an output that is coupled to the gates of the first and second control FETS 426, 428 as depicted in FIG. 4.

Still with attention to FIG. 5, attention should now also be given to FIG. 6, which is a truth table for the exemplary control portion. Inputs bsearly, wcearly, and $\overline{\text{wcearly}}$, when applied to the portion of FIG. 5, result in bswcearly as indicated, which is then inverted with inverter 508 resulting in $\overline{\text{bswc}}$ as shown in the fourth column of FIG. 6. When $\overline{\text{bswc}}$ is applied to the gates of transistors 426, 428, for the indicated operation listed in column 5 of the table of FIG. 6, the resulting condition in the last column of FIG. 6 obtains for the body of the PFET. Again, note that for the depiction in FIG. 5 and FIG. 6, it is the inverted bswc signal, namely, $\overline{\text{bswc}}$, that is applied to the gates of the FETS 426, 428, whereas, for the configuration shown in FIG. 4 with enabled inverter 430, the bswc signal is applied to the gates of FET 426, 428. As long as the signal of appropriate polarity is applied to the gates of transistors 426, 428 in order to achieve the desired biasing condition for the wells, any appropriate control scheme can be employed.

Figure 7:
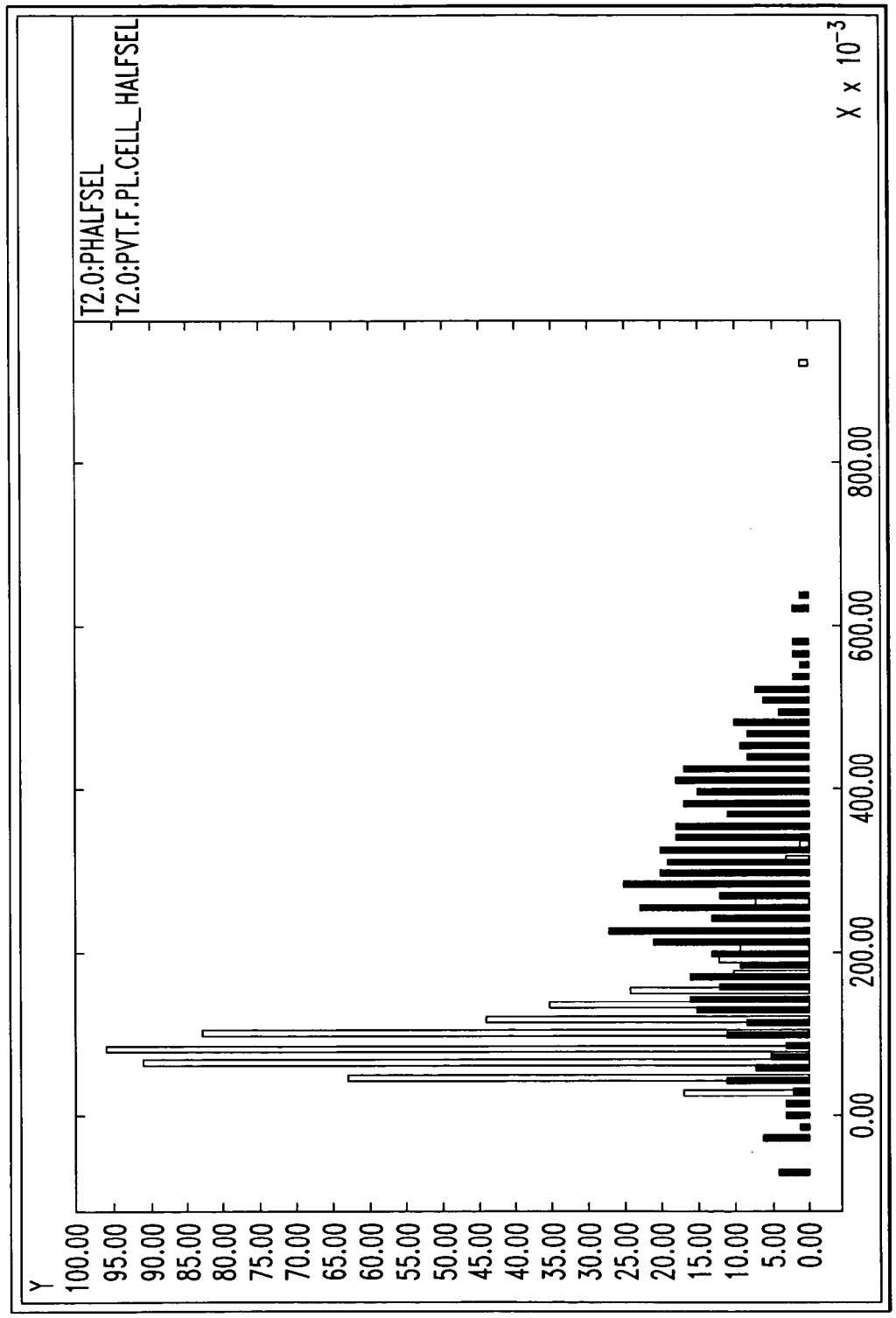
FIG. 7 shows simulation results depicting noise and PFET threshold voltage variation in a half-select mode.

Attention should now be given to FIG. 7, which is a plot of noise and threshold voltage, generated using IBM PowerSpice simulation software (other versions of the well-known Spice software, or other simulation tools, could also be employed). The X-axis is denominated in mV, while the Y-axis provides a count of the number of samples in a given range. The unshaded bars represent the noise at an internal node, while the shaded bars represent the threshold voltage variation for a PFET undergoing variable well-biasing according to an aspect of the present invention, under the applied bias in mV. Note that a larger threshold voltage causes weakness in the PFET, and the noise on the internal node increases in the half-select mode. Note also that when the PFET becomes sufficiently weak, cell failure in the half-select condition can result.

Figure 8:
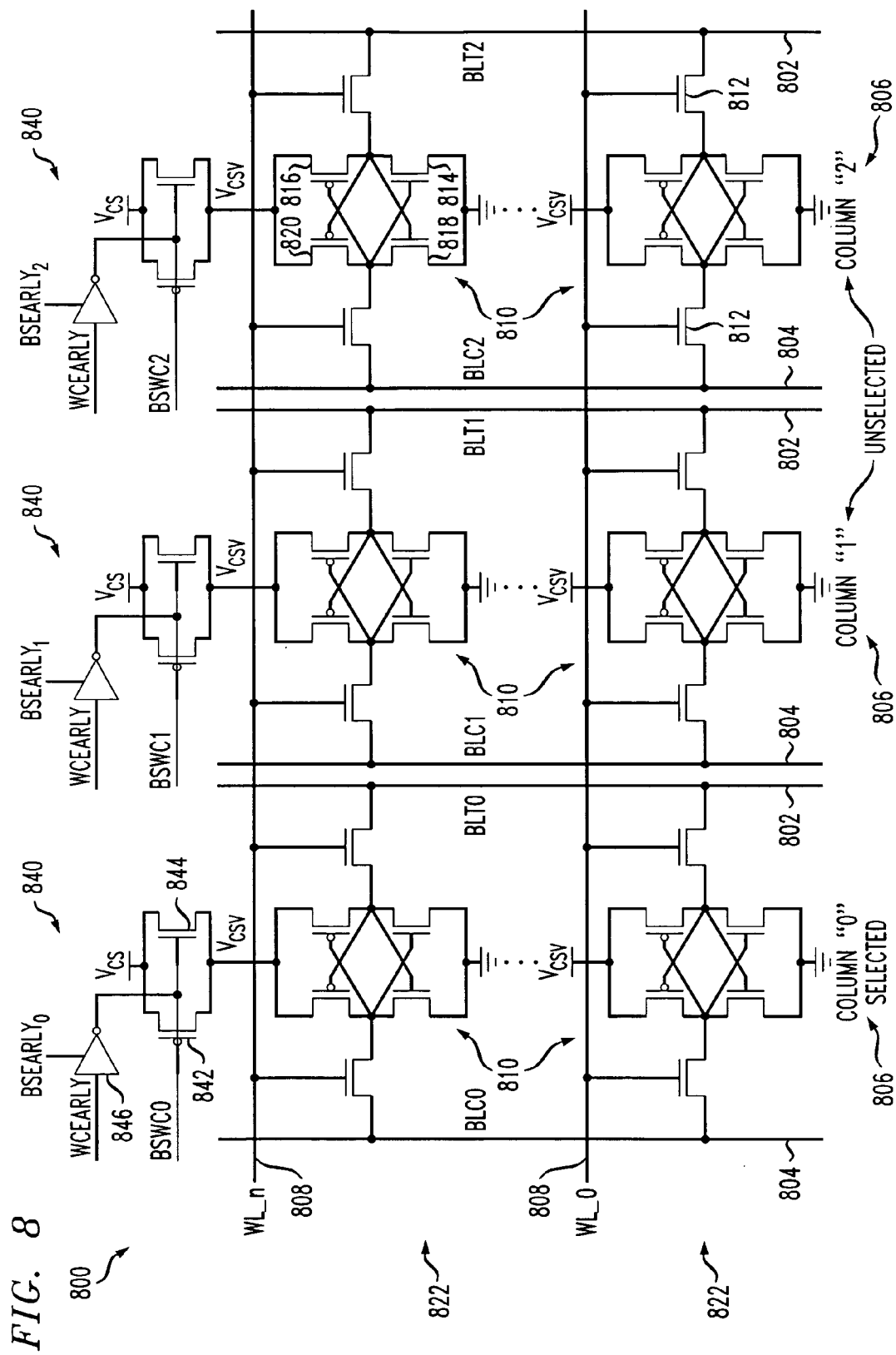
FIG. 8 depicts another exemplary embodiment of a memory circuit, including cell-biasing circuitry, according to another aspect of the present invention.

Now turning to FIG. 8, an exemplary embodiment of a memory circuit 800, according to another aspect of the present invention, is depicted. Items in FIG. 8 similar to those in FIG. 4 have received the same reference character incremented by 400, and are not separately described. Again, the 6-transistor cell is illustrative, and 8-transistor or other types of cells can be employed. The variations in construction discussed above with respect to FIG. 6 apply equally to FIG. 8. In the exemplary embodiment shown in FIG. 8, rather than applying a variable bias to the well(s), the cells themselves are variably biased. That is, cell-biasing circuitry can be provided that is configured to bias appropriate ones of the cells 810, for example, those cells associated with a given one of the columns 806, in a first manner that is appropriate for a READ operation and in a second manner, different than the first manner, that is appropriate for a WRITE operation. In FIG. 8, the cell-biasing circuitry can include a number of column cell-biasing units 840. As opposed to the FIG. 4 configuration, where a constant $V_{CSV}$ is applied to each cell, in FIG. 8, a variable $V_{CSV}$ can be applied to each cell, as the output of the appropriate cell-biasing unit. Column cell-biasing units 840 can each include first and second control FETS 842, 844, which can be of opposite types. In the exemplary embodiment of FIG. 8, FET 842 is a PFET while FET 844 is an NFET. First control FET 842 can have a first drain/source terminal configured to be held at a supply voltage $V_{CS}$, a gate configured to be set at a control voltage bswc, and a second drain/source terminal that is coupled to a given cell 810 or, for example, to some or all of the cells 810 in a given column 806. In the exemplary embodiment shown in FIG. 8, the second drain/source terminal of transistor 842 is coupled to the interconnected drain/source terminals of the PFETS in a given cell 810.

Cell-biasing unit 840 can further include a second control FET 844 that has first drain/source terminal that is coupled to a given cell 810, or some or all of the cells in a given column 806. In the exemplary embodiment shown in FIG. 8, the first drain/source terminal of the second control FET 844 is coupled to the first drain/source terminals of the PFETS in the given cell 810 for each cell in a given column 806. Transistor 844 further has a gate that is configured to be set at the control voltage bswc, and a second drain/source terminal that is configured to be set at the control voltage $V_{CS}$. Unit 840 can further include an enabled inverter 846 having a first input, for example, set at wcearly; an enable input, for example, set at bsearly; and an output that is coupled to the gates of the first and second control FETS 842, 844. In the exemplary embodiment of FIG. 8, the cell power for each cell 810 can be varied, that is, reduced or increased, depending on the operation, in order to make the PFETS relatively weak or relatively strong. Such dynamic voltage scaling can enhance the "WRITE" operation and can improve stability in a half-select condition.

FIG. 9 depicts a truth table showing the control signals bsearly, wcearly, and bswc in the first three columns. Column 4 depicts the operation, while column 5 depicts the resulting value for $V_{CSV}$. For the "READ" and half-select conditions, the cells 810 in a column 806 can be biased at the normal supply voltage $V_{CS}$. In the first two rows, the given column is unselected, and thus the bsearly signal is zero, indicating that the enabled inverter 846 is not operating. Accordingly, the control voltage bswc, in each case, zero, is applied to the gates of transistors 842, 844. When bswc is zero, PFET 842 is on, and thus $V_{CSV}$ is equal to $V_{CS}$. NFET 844 is off in this condition. Conversely, when bswc is one, PFET 842 is off and NFET 844 is conducting; however, in this condition, the value of $V_{CSV}$ will be equal to $V_{CS}$ less the threshold voltage $V_t$ for transistor 844. This is indicated in the third row of the table of FIG. 9.

Figure 10:
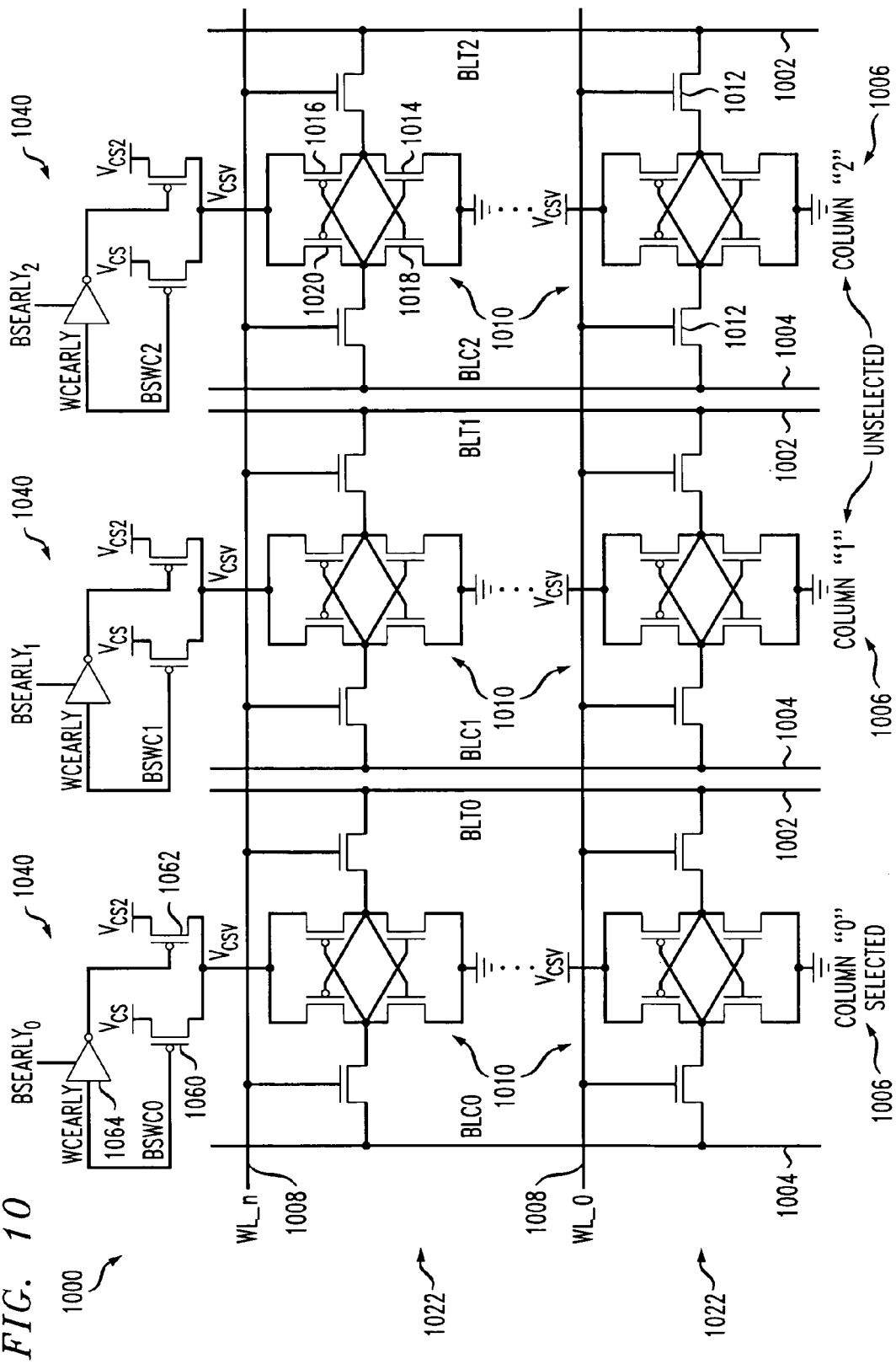
FIG. 10 depicts another alternative exemplary embodiment of a memory circuit with cell-biasing circuitry according to another aspect of the present invention.

FIG. 10 depicts an exemplary embodiment of a memory circuit 1000 in accordance with another aspect of the present invention. Items similar to those in FIG. 8 have received the same reference character incremented by 200 and will not be separately discussed. In the embodiment of FIG. 10, the cells 1010 can be biased by two different voltage supplies $V_{CS}$ and $V_{CS2}$ using column cell-biasing units 1040. In the exemplary embodiment of FIG. 10, each column cell-biasing unit 1040 can include a first FET 1060 having a first drain/source terminal configured to be held at a first supply voltage $V_{CS}$, a gate, and a second drain/source terminal coupled to a given cell 1010 or, for example, all the cells 1010 in a given column 1006. As shown in FIG. 10, the second drain/source terminal of transistor 1060 can be coupled to the first drain/source terminals of the PFETS in the given cell(s) 1010.

Unit 1040 can further include a second control FET 1062 with a first drain/source terminal that is connected to one, some, or all cells 1010 in a column 1006. In the exemplary embodiment of FIG. 10, the first drain/source terminal of second control FET 1062 can be coupled to the first drain/source terminals of the PFETS in one, some or all cells 1010 in a column 1006. Second control FET 1062 also includes a gate and a second drain/source terminal that is configured to be set at a second supply voltage $V_{CS2}$. Cell biasing unit 1040 can further include an enabled inverter 1064 having a first input coupled to the gate of the first control FET 1060, an enable input, and an output coupled to the gate of the second control FET 1062. In the exemplary embodiment shown in FIG. 10, control FETS 1060, 1062 are PFETS. When in the half-select condition, that is, the word line selected but the given column not selected, enabled inverter 1064 is not enabled and the output of enabled inverter 1064 floats, such that transistor 1062 is off. (Note that enabled inverter 1064, or any of the other enabled inverters discussed herein, may optionally be equipped with appropriate circuitry to maintain the output thereof in a known state during both the enabled and disenabled conditions, for purposes such as preventing inadvertent activation or deactivation of transistors or other devices connected thereto.) Thus, the cell is biased to $V_{CS}$ with and bswc and wcearly held at zero. During a READ operation, the inverter 1064 is enabled, and bswc and wcearly are zero, such that transistor 1060 conducts and holds the bias at $V_{CS}$. During a WRITE operation, inverter 1064 can be enabled and wcearly and bswc can be set to one, such that transistor 1060 is off but the inverted output of inverter 1064 is zero, turning transistor 1062 on to use the lower $V_{CS2}$ bias appropriate for the WRITE operation.

As noted, the circuits depicted in FIGS. 8 and 10 are exemplary in nature, and the comments about variations in design and construction for FIG. 4 also apply to FIGS. 8 and 10. Note, however, that it is believed that fabrication of the circuits of FIGS. 8 and 10 using high mobility PFETS in n-wells located in bulk, and forming the NFETS in SOI, may be advantageous.

Figure 11:
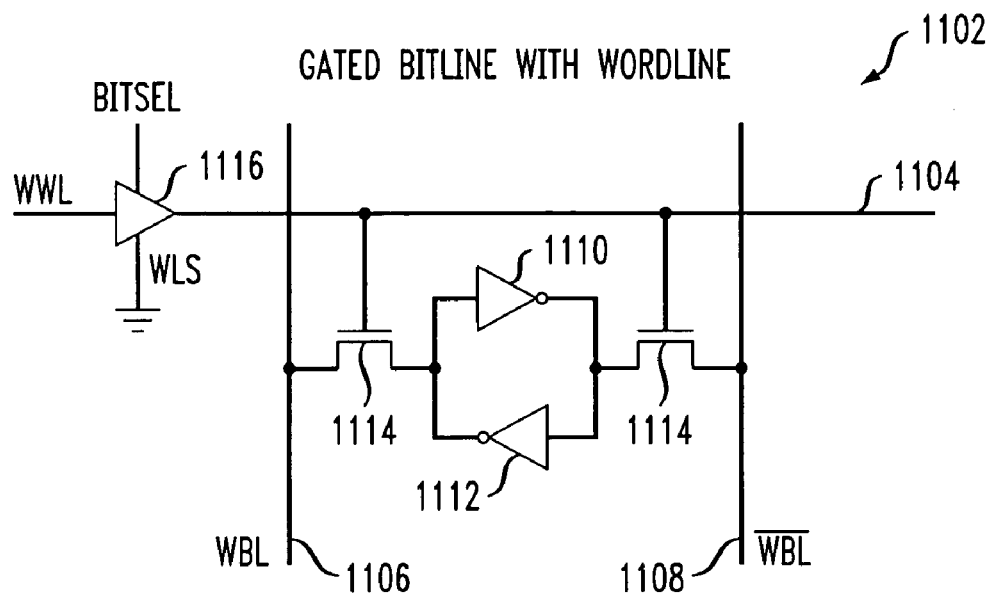
FIG. 11 depicts an exemplary scheme, according to another aspect of the present invention, for gating signals to the gates of pass transistors in a memory cell.

Attention should now be given to FIG. 11 which depicts an exemplary embodiment of a gated-bit-line-with-word line configuration which can be useful in one or more embodiments of the present invention. A cell 1102 is formed at the intersection of a word line 1104 with a bit line structure that is in turn formed by true and complementary bit lines 1106, 1108 respectively. Cell 1102 is depicted semi-schematically with cross coupled inverters 1110, 1112 and pass transistors 1114. Conventionally, when word line 1104 goes "active," transistors 1114 turn on to couple cell 1102 to the bit line structure formed by true and complementary bit lines 1106, 108. Where the given column is unselected, that is, true and complementary bit lines 1106, 1108 not activated, it may be undesirable to activate transistors 1114. Accordingly, a signal such as WWL, which would normally be used to activate word line 1104, may be gated using gating logic 1116. Logic 1116 can be configured to gate the application of signal WWL to the gates of pass transistors 1114, so as to enhance the stability of cell 1102 during the half-select condition, when the corresponding word line 1104 may be active but the bit line structure formed by true and complementary bit lines 1106, 1108 is off. For example, when WWL=1 (or WWL=0 in an "active low" design), but the bit line is off such that bitsel parameter has a value of zero, the output WLS of logic 1116 may be a logical zero. WLS may desirably be "high" only when both the word line and bit line structure are active.

Figure 12:
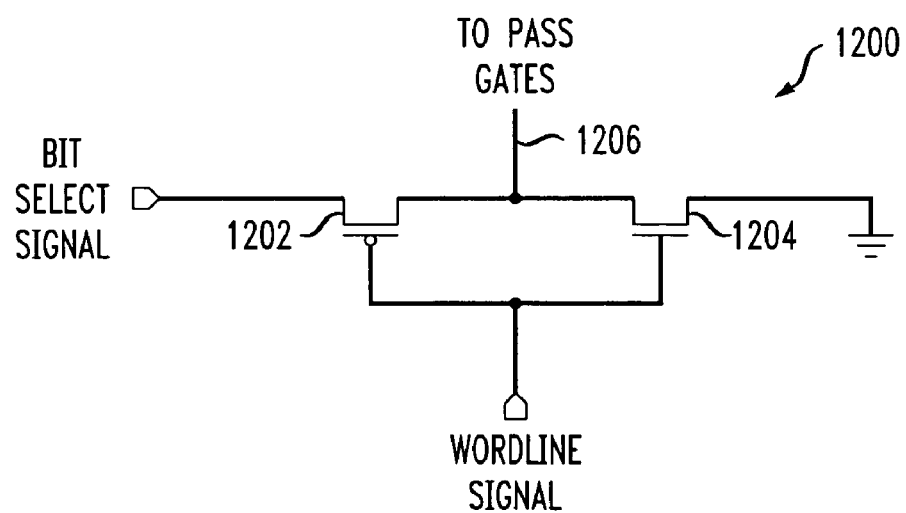
FIG. 12 depicts an exemplary embodiment, according to another aspect of the present invention, for implementing the technique of FIG. 11.

Attention should now be given to FIG. 12, which depicts one exemplary form of gating logic 1200 in accordance with an aspect of the present invention. Logic 1200 is essentially an inverter including PFET 1202 and NFET 1204. PFET 1202 and NFET 1204 each have a gate that is coupled to the word line signal. PFET 1202 has a first drain/source terminal coupled to the bit select signal, and a second drain/source terminal coupled to a first drain/source terminal of NFET 1204. NFET 1204 has a second drain/source terminal that is configured to be grounded. Second drain/source terminal of PFET 1204 and first drain/source terminal of NFET 1204 are coupled together at 1206 and can in turn be coupled to the pass gates of pass transistors 1114 to activate same under appropriate conditions. More specifically, the word line signal in FIG. 12, which may correspond to WWL in FIG. 11 is gated through the indicated circuitry before being applied to the pass gates at 1206. The configuration of FIG. 12 is designed for use with an "active low" word line. The word line signal acts as an input to the inverter, the output 1206 to the pass transistor gates acts as the output of the inverter, and the bit select signal acts as a supply voltage to the inverter. When the bit select signal is low, the inverter is off. When the bit select signal is high, the inverter is on, and the complement of the word line signal is present at the output 1206; thus, for the "active low" word line, a logical one appears at output 1206 when the word line is active, but a logical zero appears at output 1206 when the word line is high (not active—half select). Thus, the pass transistors conduct only when both the word line and bit line structure are both active. Suitable logic, not shown, establishes the "active low" signal on the word line.

The variable well-biasing, variable cell-biasing, and gating features can be employed individually, or in any combination. That is, any one, two or all three of the features, in any combination, may be employed in various embodiments of the present invention.

The circuits as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare dye or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An electronic circuit, comprising:
  a substrate of a first type of material, the first type being one of a p-type and an n-type;
  a well formed in the substrate, the well being of a second type of material that is different than the first type of material, the second type being one of the p-type and the n-type;
  at least one field effect transistor (FET) of the second type being formed on the substrate;
  at least one FET of the first type being formed in the well; and
  well-biasing circuitry configured to bias the well in a first manner configured for a first mode of operation and in a different second manner configured for a second mode of operation;
wherein:
  said bias in said first manner comprises a reduced bias, compared to said second manner, to strengthen current versus voltage characteristics of said FET of said first type during said second mode of operation; and
  said bias in said second manner comprises an increased bias, compared to said first manner, to weaken current versus voltage characteristics of said FET of said first type during said first mode of operation.

2. The electronic circuit of claim 1, wherein said first type is said p-type and said second type is said n-type, and wherein said FET of said first type employs hybrid orientation technology.

3. The electronic circuit of claim 2, wherein said well-biasing circuitry comprises:
  a first control FET having a first drain/source terminal configured to be held at a supply voltage, a gate configured to be set at a control voltage, and a second drain/source terminal coupled to said well; and
  a second control FET having a first drain/source terminal coupled to said well, a gate configured to be set to said control voltage, and a second drain/source terminal configured to be grounded, said second control FET being of a different type than said first control FET;
wherein, when said control voltage is set at a first logical level, said first control FET conducts to set said well to said supply voltage, and when said control voltage is set at a second logical level opposite said first logical level, said second control FET conducts to ground said well.

4. The electronic circuit of claim 1, further comprising FET-biasing circuitry interconnected with said at least one FET of said second type, said FET-biasing circuitry being configured to bias said FET of said second type in at least two different manners.

5. A memory circuit comprising:
  a substrate of a first type, said first type being one of a p-type and an n-type;
  a plurality of wells formed in said substrate, said wells being of a second type, said second type being one of said p-type and said n-type and being different than said first type;
  a plurality of bit line structures;
  a plurality of word lines intersecting said plurality of bit line structures to form a plurality of cell locations;
  a plurality of cells located at said plurality of cell locations, each of said cells being selectively coupled to a corresponding one of said bit line structures under control of a corresponding one of said word lines, each of said cells in turn comprising:
    at least a first field effect transistor (FET) fabricated on said substrate, said first FET being of said second type; and
    at least a second FET fabricated on a corresponding one of said wells, said second FET being of said first type; and
  well-biasing circuitry, said well-biasing circuitry being configured to bias appropriate ones of said wells in a first manner preselected for a READ operation and in a second manner, different than said first manner, preselected for a WRITE operation; wherein:
  said bias in said first manner comprises a reduced bias, compared to said second manner, to strengthen current versus voltage characteristics of said FET of said first type during said READ operation; and
  said bias in said second manner comprises an increased bias, compared to said first manner, to weaken current versus voltage characteristics of said FET of said first type during said WRITE operation.

6. The memory circuit of claim 5, wherein said first type is said p-type and said second type is said n-type, and wherein said FETS of said first type employ hybrid orientation technology.

7. The memory circuit of claim 6, wherein said well-biasing circuitry is configured to bias appropriate ones of said wells in said first manner during a half-select condition.

8. The memory circuit of claim 6, wherein:
  said plurality of wells comprise at least one well for each of said second FETS;
  said plurality of cells are formed as a plurality of columns, each of said columns corresponding to a given one of said bit line structures; and
  those of said wells associated with said second FETS of those cells formed in a given one of said columns are electrically interconnected.

9. The memory circuit of claim 8, wherein said well-biasing circuitry comprises a plurality of column well-biasing units, each of said column well-biasing units in turn comprising:
  a first control FET having a first drain/source terminal configured to be held at a supply voltage, a gate configured to be set at a control voltage, and a second drain/source terminal coupled to said electrically interconnected wells of a corresponding one of said columns; and
  a second control FET having a first drain/source terminal coupled to said electrically interconnected wells of said corresponding one of said columns, a gate configured to be set to said control voltage, and a second drain/source terminal configured to be grounded, said second control FET being of a different type than said first control FET;

wherein, when said control voltage is set at a first logical level, said first control FET conducts to set said electrically interconnected wells of said corresponding one of said columns to said supply voltage, and when said control voltage is set at a second logical level opposite said first logical level, said second control FET conducts to ground said electrically interconnected wells of said corresponding one of said columns.

10. The memory circuit of claim 9, wherein each of said column well-biasing units further comprises an enabled inverter having a first input, an enable input, and an output coupled to said gates of said first and second control FET.

11. The memory circuit of claim 9, wherein each of said column well-biasing units further comprises:
   a third control FET having a fist drain/source terminal configured to be held at a control voltage, a gate, and a second drain/source terminal;
   a fourth control FET having a first drain/source terminal coupled to said first drain/source terminal of said third control FET, a gate, and a second drain/source terminal;
   a fifth control FET having a first drain/source terminal coupled to said second drain/source terminals of said third and fourth control FET, a gate coupled to said gate of said third control FET, and a second drain/source terminal configured to be grounded; and
   an inverter having an input coupled to said second drain/source terminals of said third and fourth control FETS and said first drain/source terminal of said fifth control FET, and having an output coupled to said gates of said first and second control FETS.

12. The memory circuit of claim 9, further comprising cell-biasing circuitry, said cell-biasing circuitry in turn comprising a plurality of column cell-biasing units, each of said column cell-biasing units being configured to bias said cells of a corresponding one of said columns in at least two different manners.

13. A memory circuit comprising:
   a substrate of a first type, said first type being one of a p-type and an n-type;
   a plurality of wells formed in said substrate, said wells being of a second type, said second type being one of said p-type and being different than said first type;
   a plurality of bit line structures;
   a plurality of word lines intersecting said plurality of bit line structures to form a plurality of cell locations;
   a plurality of cells located at said plurality of cell locations each of said cells being selectively coupled to a corresponding one of said bit line structures under control of a corresponding one of said word lines, each of said cells in turn comprising:
      at least a first field effect transistor FET fabricated on said substrate, said first FET being of said second type; and
      at least a second FET fabricated on a corresponding one of said wells, said second FET being of said first type;
   well-biasing circuitry, said well-biasing circuitry being configured to bias appropriate ones of said wells in a first manner preselected for a READ operation and in a second manner, different than said first manner, preselected fox a WRITE operation; and
   gating logic configured to gate said selective coupling of a given one of said cells to said corresponding one of said bit line structures under said control of said corresponding one of said word lines, so as to enhance stability of said given one of said cells during a half select condition when said corresponding one of said word lines is in an "ON" condition and said corresponding one of said bit line structures is in an "OFF" condition.

14. The memory circuit of claim 13, wherein said word lines are configured in an "active low" manner, and wherein said gating logic in turn comprises to an inverter having a bit select signal as a supply voltage, an "active low" word line signal as an input, and an output configured to enable said selective coupling when said bit select signal and said word line signal are both active.

15. A memory circuit comprising:
   a substrate of a first type, said first type being one of a p-type and a n-type;
   a plurality of wells formed in said substrate said wells being of a second type, said second type being one of said p-type and said n-type and being different than said first type;
   a plurality of bit line structures;
   a plurality of word lines intersecting said plurality of bit line structures to form a plurality of cell locations;
   a plurality of cells located at said plurality of cell locations, and organized into columns associated with said bit line structures, each of said cells being selectively coupled to a corresponding one of said bit line strictures under control of a corresponding one of said word lines, each of said cells in turn comprising:
      at least a first field effect transistor (FET) fabricated on said substrate, said first FET being of said second type; and
      at least a second FET fabricated on a corresponding one of said wells, said second FET being of said first type; and
   cell-biasing circuitry that is configured to bias appropriate ones of said cells associated with one of said columns in a first manner preselected for a READ operation and in a second manner, different than said first manner, preselected for a WRITE operation;
wherein:
   said cell-biasing circuitry comprises a plurality of column cell-biasing units, each of said column cell-biasing units in turn comprising:
      a first control FET having a first drain/source terminal configured to be held at a supply voltage, a gate configured to be set at a control voltage, and a second drain/source terminal coupled to said cells in a corresponding one of said columns;
      a second control FET having a first drain/source terminal coupled to said second drain/source terminal of said first control FET, a gate configured to be set to said control voltage, and a second drain/source terminal configured to be held at said supply voltage, said second control FET being of a different type than said first control FET; and
      an enabled inverter having a first input, an enable input, and an output coupled to said gates of said first control FET and said second control FET.

16. The memory circuit of claim 15, wherein said first type is said p-type and said second type is said n-type, and wherein said FETS of said first type employ hybrid orientation technology, thither comprising well-biasing circuitry, said well-biasing circuitry being configured to bias appropriate ones of said wells in a first well-biasing manner preselected for said READ operation and in a second well-biasing manner, different than said first well-biasing manner, preselected for said WRITE operation.

17. A memory circuit comprising:
a substrate of a first type, said first type being one of p-type and an n-type;
a plurality of wells formed in said substrate, said wells being of a second type, said second type being one of said p-type and said n-type and being different than said first type;
a plurality of bit line structures;
a plurality of word lines intersecting said plurality of bit line structures to form a plurality of cell locations;
a plurality of cells located at said plurality of cell location, and organized into columns associated with said bit line structures, each of said cells being selectively coupled to a corresponding one of said bit line structures under control of a corresponding one of said word lines each of said cells in turn comprising:
  at least a first field effect transistor (FET) fabricated on said substrate, said first FET being of said second type; and
  at least a second FET fabricated on a corresponding one of said wells, said second FET being of said first type; and
cell-biasing circuitry that is configured to bias appropriate ones of said cells associated with one of said columns in a first manner reselected for a READ operation and in a second manner, different than said first manner, preselected for a WRITE operation;
wherein:
  said cell-biasing circuitry comprises a plurality of column cell-biasing units, each of said column cell-biasing units in turn comprising:
    a first control FET having a first drain/source terminal configured to be held at a first supply voltage, a gate, and a second drain/source terminal coupled to said cells in a corresponding one of said columns;
    a second control FET having a first drain/source terminal coupled to said second drain/source terminal of said first control FET, a gate, and a second drain/source terminal configured to be set at a second supply voltage; and
    an enabled inverter having a first input coupled to said gate of said first control FET, an enable input, and an output coupled to said gate of said second control FET.

18. A memory circuit comprising:
a substrate of a first type, said first type being one of a p-type and an n-type;
a plurality of wells formed in said substrate, said wells being of a second type, said second type being one of said p-type and said n-type and being different than said first type;
a plurality of bit line structures;
a plurality of word lines intersecting said plurality of bit line structures to form a plurality of cell locations;
a plurality of cells located at said plurality of cell locations, and organized into columns associated with said bit line structures, each of said cells being selectively coupled to a corresponding one of said bit line structures under control of a corresponding one of said word lines, each of said cells in turn comprising:
  at least a first field effect transistor (FET) fabricated on said substrate, said first FET being of said second type; and
  at least a second FET fabricated on a corresponding one of said wells, said second FET being of said first type;
cell-biasing circuitry that is configured to bias appropriate ones of said cells associated with one of said columns in a first manner preselected for a READ operation and in a second manner, different than said first manner, preselected for a WRITE operation; and
gating logic configured to gate said selective coupling of a given one of said cells to said corresponding one of said bit line structures under said control of said corresponding one of said word lines, so as to enhance stability of said given one of said cells during a half select condition when said corresponding one of said word lines is in an "ON" condition and said corresponding one of said bit line structures is in an "OFF" condition.

19. The memory circuit of claim 18, wherein said word lines are configured in an "active low" manner, and wherein said gating logic in turn comprises an inverter having a bit select signal as a supply voltage, an "active low" word line signal as an input, and an output configured to enable said selective coupling when said bit select signal and said word line signal are both active.

20. The memory circuit of claim 17, wherein said first type is said p-type and said second type is said n-type, and wherein said FET of said first type employ hybrid orientation technology, further comprising well-biasing circuitry, said well-biasing circuitry being configured to bias appropriate ones of said wells in a first well-biasing manner preselected for said READ operation and in a second well-biasing manner, different than said first well-biasing manner, preselected for said WRITE operation.

* * * * *